(12) United States Patent
Okada et al.

(10) Patent No.: US 6,467,141 B2
(45) Date of Patent: Oct. 22, 2002

(54) METHOD OF ASSEMBLING MICRO-ACTUATOR

(75) Inventors: Toru Okada, Kawasaki (JP); Kenji Iketaki, Kawasaki (JP); Hidehiko Kobayashi, Kawasaki (JP); Yutaka Noda, Kawasaki (JP); Masayuki Kitajima, Kawasaki (JP); Seiichi Shimoura, Kawasaki (JP); Masakazu Takesue, Kawasaki (JP); Keiichi Yamamoto, Kawasaki (JP); Hisao Tanaka, Kawasaki (JP); Masanao Fujii, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 57 days.

(21) Appl. No.: 09/820,553

(22) Filed: Mar. 29, 2001

(65) Prior Publication Data

US 2002/0059717 A1 May 23, 2002

(30) Foreign Application Priority Data

Nov. 22, 2000 (JP) ........................................ 2000-356163

(51) Int. Cl.$^7$ ............................................... H04R 17/10
(52) U.S. Cl. ..................................... 29/25.35; 29/603.2
(58) Field of Search ........................... 29/25.35, 603.03, 29/603.2, 831; 156/291, 297, 322

(56) References Cited

U.S. PATENT DOCUMENTS 5,504,890 A * 4/1996 Yoshinaga et al. ......... 29/25.35
5,983,471 A * 11/1999 Osawa ....................... 29/25.35

* cited by examiner

Primary Examiner—Robert M. Fetsuga
(74) Attorney, Agent, or Firm—Greer, Burns & Crain, Ltd.

(57) ABSTRACT

A method of assembling a micro-actuator is provided in which a base frame having a plurality of actuator bases is placed on a stage, a first adhesive is applied to each of the actuator bases, and a base electrode frame having a plurality of base electrodes is placed on the first adhesive. The first adhesive is semi-cured by heating and pressing. A second adhesive is applied to each of the base electrodes, and a plurality of piezoelectric elements are placed on the second adhesive. The second adhesive is semi-cured by heating and pressing. A third adhesive is,applied to the piezoelectric elements, and a movable electrode frame having a plurality of movable electrodes is placed on the third adhesive. The third adhesive is semi-cured by heating and pressing. Next, a fourth adhesive is applied to each of the movable electrodes, and a hinge plate frame having a plurality of hinge plates is placed on the fourth adhesive. The fourth adhesive is semi-cured by heating and pressing. Finally, the adhered laminate thus obtained is placed in a heating furnace, and is heated at a predetermined temperature for a predetermined period of time, whereby each of the adhesives is fully cured.

14 Claims, 14 Drawing Sheets

METHOD OF ASSEMBLING MICRO-ACTUATOR

BACKGROUND OF THE INVENTION

1. Field of the Invention

The present invention relates to a method of assembling a micro-actuator for fine movement of a magnetic head.

2. Description of the Related Art

In recent years, reductions in size and thickness of magnetic disk devices, a kind of external storage device for computers, have been under way and, further, reductions in electric power consumption is requested. In addition, magnetic disk devices with higher recording density and larger capacity are demanded. Larger capacity of the magnetic disk devices can generally be realized by increasing the recording capacity per disk. However, an increase in recording density without changing the diameter of the disk leads to narrower track pitch; accordingly, the technical problem is how accurate the head device for reading and writing data on record tracks is positioned, and a head actuator with good positioning accuracy is desired.

Hitherto, in order to position a head with high accuracy in a magnetic disk device, generally, trials have been made to enhance rigidity of movable portions such as an actuator arm and raise the main resonance point frequency in in-plane directions. However, improvement of resonance point has a limit, and even if the in-plane resonance point of the movable portion can be largely raised, there is still the problem that vibration is generated due to spring characteristics of a bearing supporting the movable portion, resulting in a reduction of positioning accuracy.

As a means for solving the above problems, a so-called two-stage actuator in which a second actuator for following the tracks, namely, a tracking actuator is mounted on the tip of an arm of a head actuator, has been proposed. The tracking actuator is for minutely moving the head provided at a tip end portion of an arm, independently from motions of the head actuator, to achieve tracking of the head. A two-stage actuator in which accurate positioning of the head is accomplished by utilizing laminate type piezoelectric elements as the tracking actuator for the two-stage actuator has been proposed.

For example, two laminate type piezoelectric elements are disposed on both sides of an actuator arm, and a voltage is impressed in such a direction that the piezoelectric element on one side is elongated while the piezoelectric element on the other side shrinks, whereon the head is rotated in the direction of the piezoelectric element shrinking under the impressed voltage. However, in the two-stage actuator utilizing the laminate type piezoelectric element according to the prior art, depolarization of the piezoelectric element occurs due to impression of a voltage in the direction reverse to the polarization direction of the piezoelectric element, exposing of the piezoelectric element to a high-temperature atmosphere, aging or the like; as a result, displacement per unit voltage gradually diminishes. Therefore, there is a problem that when the system is used for a certain long time, a desired stroke cannot be obtained. Furthermore, the two-stage actuator according to the prior art utilizing the laminate type piezoelectric elements has a disadvantage that productivity of the laminate type piezoelectric elements is bad, and high accuracy or precision of outer sizes of the elements is required, leading to high cost.

Two-stage actuators utilizing a shearing type piezoelectric element in place of the laminate type piezoelectric element having the above-mentioned many problems have been proposed in Japanese Patent Laid-open No. Hei 10-293979 and Japanese Patent Laid-open No. Hei 11-31368. A minute moving mechanism for head disclosed in the Japanese Patent Laid-open No. Hei 11-31368 has a three-layer structure in which two shearing type piezoelectric elements having different polarization directions are mounted on an electrode formed at the tip of a head arm, and a head suspension is mounted thereon through a movable member therebetween.

Therefore, this structure has a larger thickness from the head arm to the suspension, as compared with the conventional structure in which the suspension is fitted to the head arm with only a spacer. Thus, the two-stage actuator with the three-layer structure is unsuitable for reduction in thickness of the head actuator. Further, the increased thickness leads to wider distance between disk surfaces, whereby the number of disks mountable in the disk device is decreased, and storage capacity is also decreased as compared with the conventional disk device having the same height.

A minute moving mechanism for head which solves the above-mentioned problems has been proposed by the present applicant. In the invention of the previous application, an actuator base bent in a crank shape is fixed to a tip end portion of an actuator arm. A base electrode, a shearing type piezoelectric element, a movable electrode and a hinge plate are laminated and fixed on the actuator base, and a suspension is fixed to the hinge plate. With the actuator base bent in a crank shape, the top surface of the actuator base and the top surface of the hinge plate can be flush with each other, so that the minute moving mechanism for head utilizing the shearing type piezoelectric element can be made thinner.

In the invention of the previous application, electrical conduction must be provided between the shearing type piezoelectric element and the base electrode and the movable electrode, and, therefore, the base electrode and the movable electrode have been fixed to the piezoelectric element by use of a conductive adhesive. On the other hand, electrical insulation must be kept between the actuator base and the base electrode and between the movable electrode and the hinge plate, and, therefore, fixation between the actuator base and the base electrode and between the movable electrode and the hinge plate has been made by use of an ordinary insulating adhesive.

In the method of producing a micro-actuator using a conductive adhesive and an ordinary insulating adhesive according to the invention of the previous application, it is needed to selectively use the two types of adhesive, which leads to complicated production steps. Further, use of a conductive adhesive may easily be attended by generation of a short-circuit due to a mistake in production process. Thus, it is contemplated to contrive use of a single adhesive by using an insulating adhesive also for adhesion of the electrode and the piezoelectric element. However, where an adhesive is merely applied and cured, an adhesive layer thin enough to obtain electrical connection cannot be formed.

Therefore, a method of applying a pressure at the time of curing the adhesive is contemplated. However, where pressure is merely applied upon each lamination of component parts through an adhesive, the thickness of the adhesive layer on application of pressure is added to the thickness of component parts, so that variations of the thickness of the component parts will come out as large variations of the total thickness. Further, where electrical connection is envisioned, two shearing type piezoelectric elements are mounted on the base electrode, and the difference between the thicknesses of left and right piezoelectric elements may cause variations of the adhesive layer even if they are pressed in the same manner. Furthermore, in the conventional method of assembling a micro-actuator, each micro-actuator has been assembled individually, which is unsuitable for mass production.

SUMMARY OF THE INVENTION

Accordingly, it is an object of the present invention to provide a method of assembling a micro-actuator which is suitable for mass production.

In accordance with an aspect of the present invention, there is provided a method of assembling a micro-actuator, comprising the steps of: placing a base frame having a plurality of actuator bases on a stage; applying a first adhesive to each of the actuator bases; placing a base electrode frame having a plurality of base electrode on the first adhesive applied to the base frame; clamping the base frame and the base electrode frame between the stage and a first head, followed by heating for a first predetermined period of time while exerting a predetermined first press load onto the first head to semi-cure the first adhesive; applying a second adhesive to each of the base electrodes; placing a plurality of piezoelectric elements on the second adhesive applied to each of the base electrodes; clamping the base frame, the base electrode frame and the piezoelectric elements between the stage and a second head, followed by heating for a second predetermined period of time while exerting a predetermined second press load onto the second head to semi-cure the second adhesive; applying a third adhesive to the piezoelectric elements; placing a movable electrode frame having a plurality of movable electrodes on the third adhesive applied to each of the piezoelectric elements; clamping the base frame, the base electrode frame, the piezoelectric elements and the movable electrode frame between the stage and a third head, followed by heating for a third predetermined period of time while exerting a predetermined third press load onto the third head to semi-cure the third adhesive; applying a fourth adhesive to each of the movable electrodes; placing a hinge plate frame having a plurality of hinge plates on the fourth adhesive applied to each of the movable electrodes; and clamping the base frame, the base electrode frame, the piezoelectric elements, the movable electrode frame and the hinge plate frame between the stage and a fourth head, followed by heating for a fourth predetermined period of time while exerting a predetermined fourth press load onto the fourth head to semi-cure the fourth adhesive.

Preferably, the stage has a plurality of positioning pins, whereas the base frame, the base electrode frame, the movable electrode frame and the hinge plate frame respectively have a plurality of positioning holes. The base frame, the base electrode frame, the movable electrode frame and the hinge plate frame are mounted on the stage while being relatively positioned by insertion of the positioning pins in the positioning holes.

Preferably, the stage includes a work mount portion having a plurality of positioning pins, a predetermined height from a bottom surface of the stage and a predetermined size. The base frame, the base electrode frame, the movable electrode frame and the hinge plate frame are once mounted on a holder having an opening larger than the size of the work mount portion, before being placed on the work mount portion of the stage.

A method of assembling a micro-actuator according to the present invention further comprises a step of heating the adhered laminate at a predetermined temperature for a fifth predetermined period of time to fully cure the first to fourth adhesives. Each of the actuator bases, each of the base electrodes, each of the movable electrodes and each of the hinge plates are connected respectively to the base frame, the base electrode frame, the movable electrode frame and the hinge plate frame by, a bridge. A method of assembling a micro-actuator according to the invention further comprises a step of cutting each of the bridges of the base electrode frame, the movable electrode frame and the hinge plate frame after the step of fully curing the adhesives.

In accordance with another aspect of the present invention, there is provided a method of assembling a micro-actuator, comprising the steps of: placing a base frame having a plurality of actuator bases on a stage; applying a first adhesive to each of the actuator bases; placing a base electrode frame having a plurality of base electrodes on the first adhesive applied to the base frame; clamping the base frame and the base electrode frame between the stage and a first head, followed by heating for a first predetermined period of time while exerting a predetermined first press load onto the first head to semi-cure the first adhesive; applying a second adhesive to each of the base electrodes; placing a plurality of piezoelectric elements on the second adhesive applied to each of the base electrodes; clamping the base frame, the base electrode frame and the piezoelectric elements between the stage and a second head, followed by heating for a second predetermined period of time while exerting a predetermined second press load onto the second head to semi-cure the second adhesive; applying a third adhesive to the piezoelectric elements; placing a hinge plate frame having a plurality of hinge plates on the third adhesive applied to each of the piezoelectric elements; and clamping the base frame, the base electrode frame, the piezoelectric elements and the hinge plate frame between the stage and a third head, followed by heating for a third predetermined period of time while exerting a predetermined third press load onto the third head to semi-cure the third adhesive.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1A:
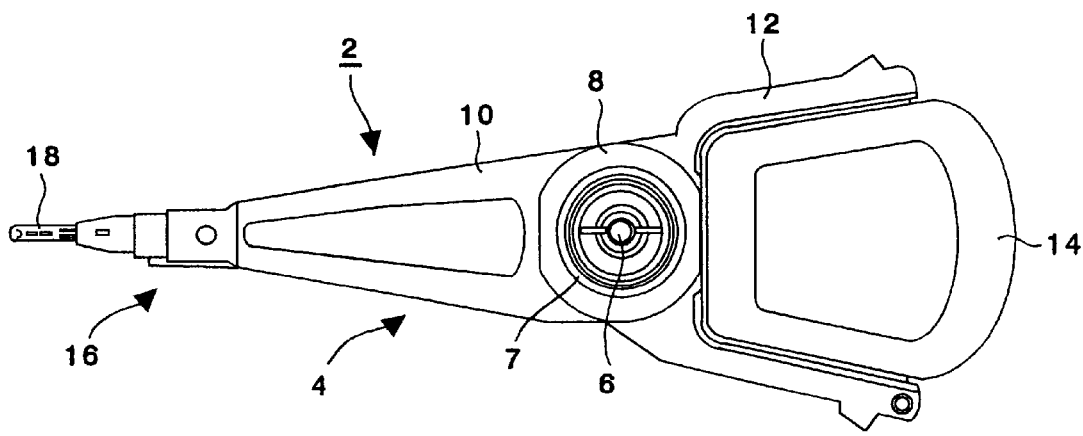
FIG. 1A is a plan view of a two-stage actuator utilizing a piezo micro-actuator assembled by a method according to the present invention.
Figure 1B:
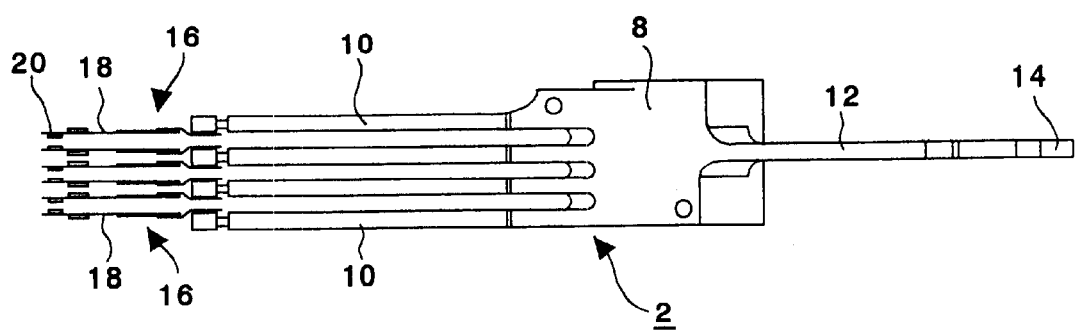
FIG. 1B is a side view of the same.

Hereinafter, embodiments of the present invention will be described in detail referring to the drawings. Referring to FIG. 1A, there is shown a plan view of a two-stage head actuator adopting a piezo micro-actuator as a tracking actuator. FIG. 1B is a side view of the same.

Numeral 2 denotes a two-stage head actuator composed of an actuator assembly 4 and a magnetic circuit (not shown). The actuator assembly 4 is rotatably fitted on a shaft 6 fixed to a base (not shown) of a magnetic disk apparatus. The actuator assembly 4 comprises an actuator block 8 rotatably fitted on the shaft 6 through a bearing 7, a plurality of actuator arms 10 formed as one body with the actuator block 8 and extended in one direction, and a coil support member 12 extended in the direction opposite to the actuator arms 10.

A flat coil 14 is supported by the coil support member 12, and the magnetic circuit (not shown) fixed to the base of the magnetic disk apparatus and the coil 14 inserted in a gap of the magnetic circuit constitute a voice coil motor (VCM). A piezo micro-actuator 16 assembled by the present invention is fitted to a tip end portion of each of the actuator arms 10, and a base end portion of a suspension 18 is fixed to the piezo micro-actuator 16. A tip end portion of the suspension 18 supports a magnetic head 20.

Figure 2:
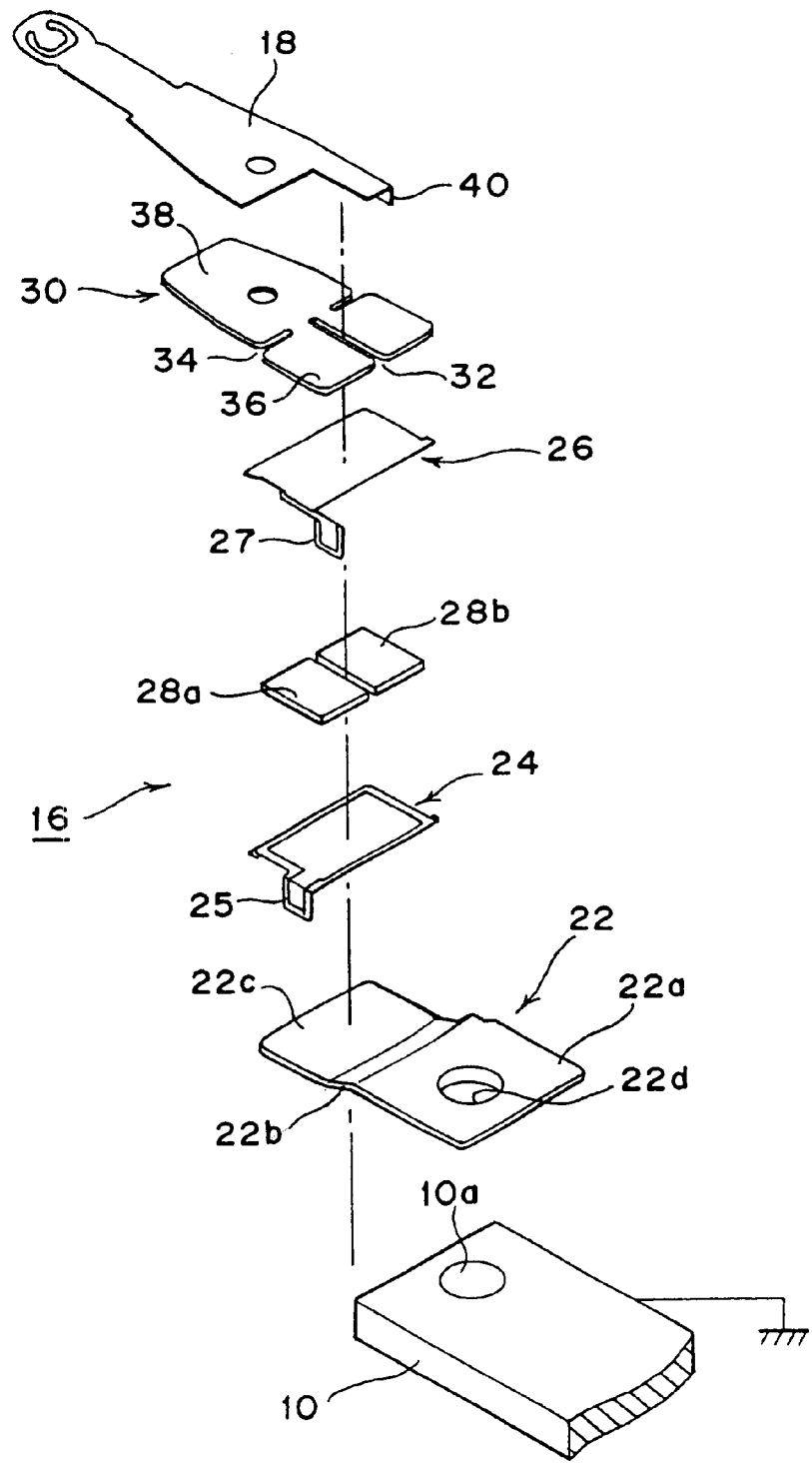
FIG. 2 is an exploded perspective view of a piezo micro-actuator according to a first embodiment.

Referring to FIG. 2, there is shown an exploded perspective view of the piezo micro-actuator 16 according to a first embodiment of the present invention. A fixed portion 22a of an actuator base 22 is fixed by a method in which a caulking projection 22d formed as one body with the fixed portion 22a is inserted in a caulking hole 10a formed in the actuator arm 10 and caulking is carried out. The actuator arms 10 are grounded. A tip end portion 22c of the actuator base 22 is one step lower than the fixed portion 22a, with a step portion 22b therebetween, and a pair of shearing type piezoelectric elements 28a and 28b clamped between a base electrode 24 and a movable electrode 26 are fitted on the tip end portion 22c. The pair of shearing type piezoelectric elements 28a and 28b have polarization directions opposite to each other and perpendicular to the thickness direction of the piezoelectric elements 28a and 28b. The polarization directions are parallel with the longitudinal direction of the actuator arms 10.

The base electrode 24 is provided with a tab (wiring lead portion) 25 projected sideways from the tip end portion 22c of the actuator base 22. Similarly, the movable electrode 26, is provided with a tab 27 projected sideways from the tip end portion 22c of the actuator base 22. A hinge plate or movable plate 30 has a base portion 36, defined by a first cutout 32 and a second cutout 34, and a movement amount enlarging portion 38. The base portion 36 of the hinge plate 30 is fitted on the movable electrode 26, and the suspension 18 is attached to the movement amount enlarging portion 38 of the movable plate 30 by spot welding or the like. Numeral 40 denotes a relay FPC fitting portion provided on a side surface on a base end portion side of the suspension 18.

Figure 3A:
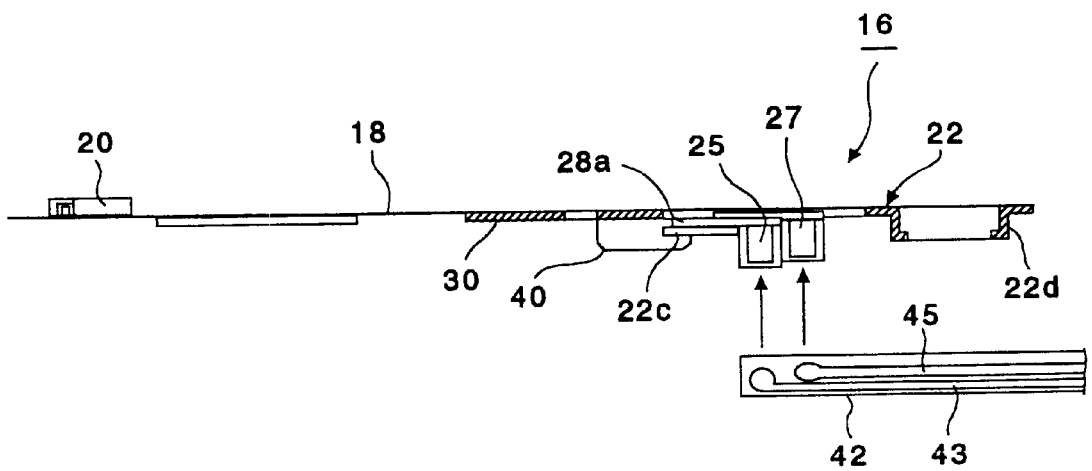
FIG. 3A is a side view of a head assembly adopting the piezo micro-actuator according to the first embodiment.
Figure 3B:
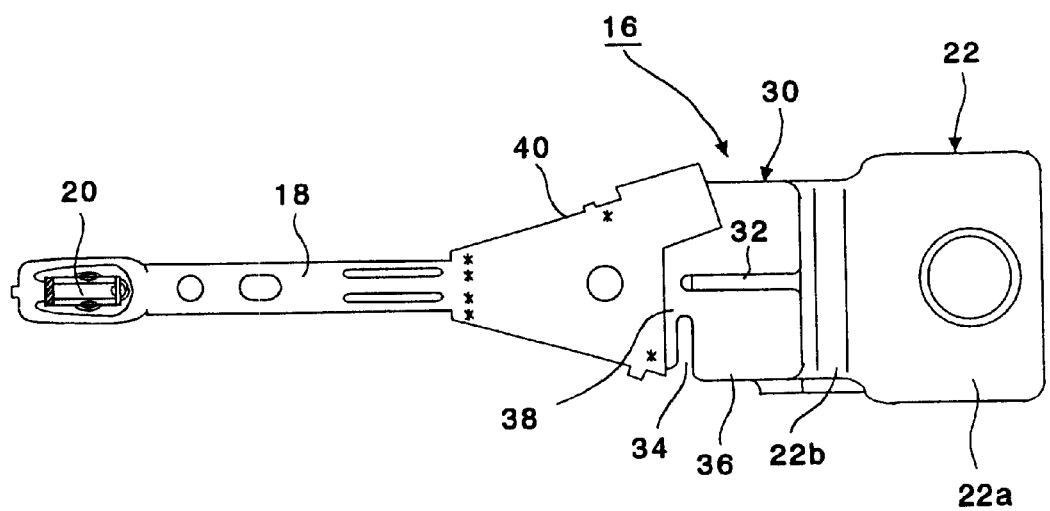
FIG. 3B is a plan view of the same.

Referring to FIG. 3A, there is shown a side view of a head assembly adopting the piezo micro-actuator 16 according to the first embodiment. FIG. 3B is a plan view of the same. As shown in FIG. 3A, when the piezo micro-actuator 16 is assembled, the tab 25 of the base electrode 24 and the tab 27 of the movable electrode 26 are disposed adjacently to each other. As a result, the relay FPC 42 provided with lead patterns 43 and 45 for the tabs 25 and 27 can be easily soldered, and application of a voltage to the base electrode 24 and the movable electrode 26.can be easily carried out.

Figure 4:
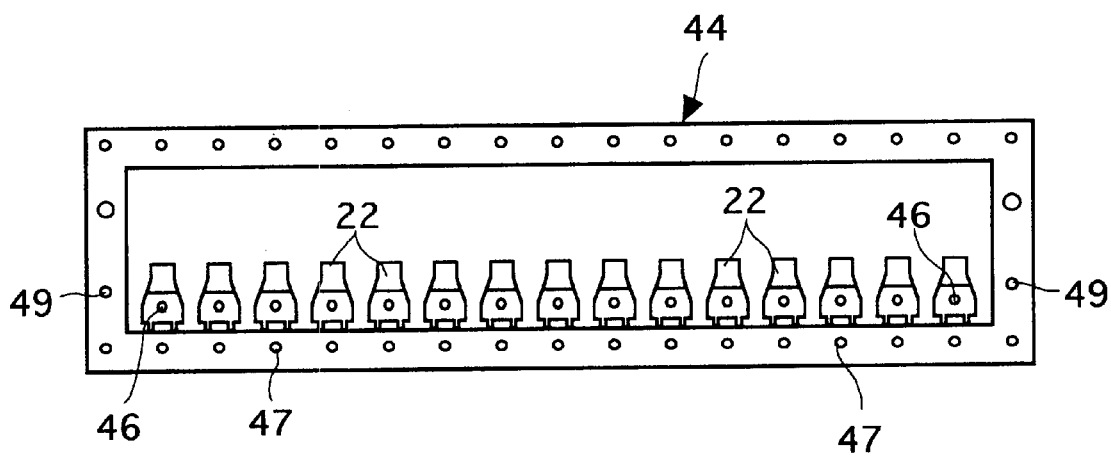
FIG. 4 is a plan view of a base frame.

A method of assembling a micro-actuator according to the present invention will now be described in detail, referring to FIGS. 4 to 19. Referring to FIG. 4, there is shown a plan view of a base frame 44 to which a plurality (16 pieces in this embodiment) of actuator bases 22 are connected integrally. Each of the actuator bases 22 has a positioning hole 46. Further, the base frame 44 has a plurality of positioning holes 47 and 49.

Figure 5:
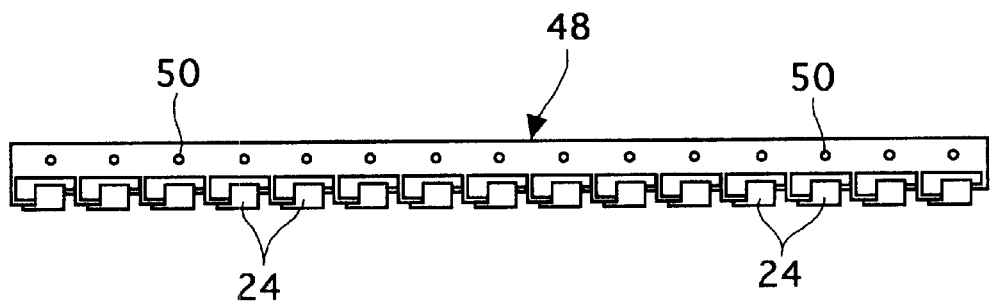
FIG. 5 is a plan view of a base electrode frame.
Figure 6:
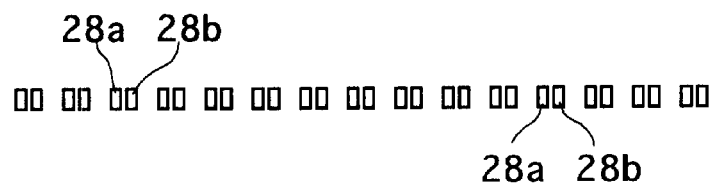
FIG. 6 is a schematic view showing piezoelectric elements mounted on a plurality of base electrodes.

FIG. 5 shows a plan view of a base electrode frame 48 to which a plurality (16 pieces in this embodiment) of the base electrodes 24 are connected integrally. The base electrode frame 48 has a plurality of positioning holes 50. FIG. 6 generally shows a series of shearing type piezoelectric elements 28a and 28b, and a pair of the piezoelectric elements 28a and 28b are mounted on each base electrode 24. The pair of piezoelectric elements 28a and 28b have polarization directions opposite to each other and perpendicular to the thickness direction of the elements.

Figure 7:
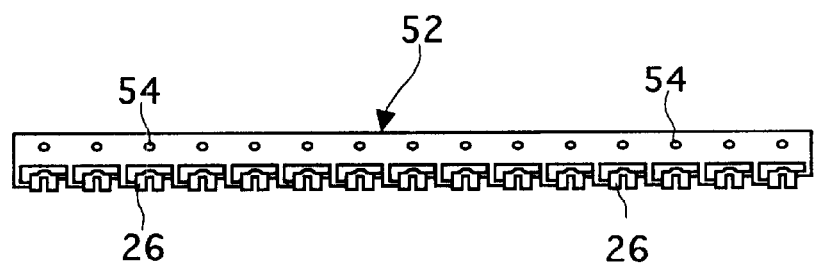
FIG. 7 is a plan view of a movable electrode frame.
Figure 8:
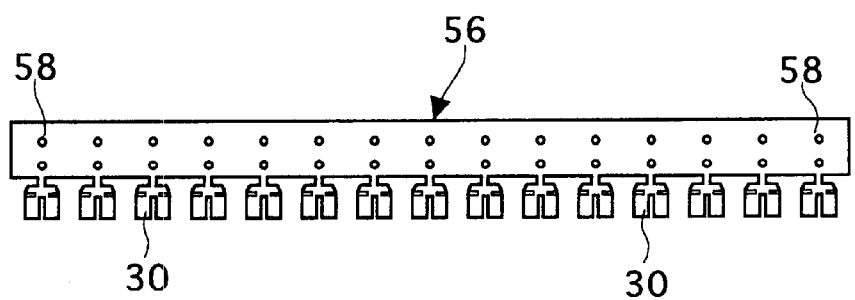
FIG. 8 is a plan view of a hinge plate frame.

Referring to FIG. 7, there is shown a plan view of a movable electrode frame 52 to which a plurality (16 pieces in this embodiment) of movable electrodes 26 are connected integrally. The movable electrode frame 52 has a plurality of positioning holes 54. FIG. 8 shows a plan view of a hinge plate frame 56 to which a plurality (16 pieces in this embodiment) of hinge plates 30 are connected integrally. The hinge plate frame 56 has a plurality of positioning holes 58. The base frame 44, the base electrode frame 48, the movable electrode frame 52 and the hinge plate frame 56 are formed of stainless steel.

Figure 9:
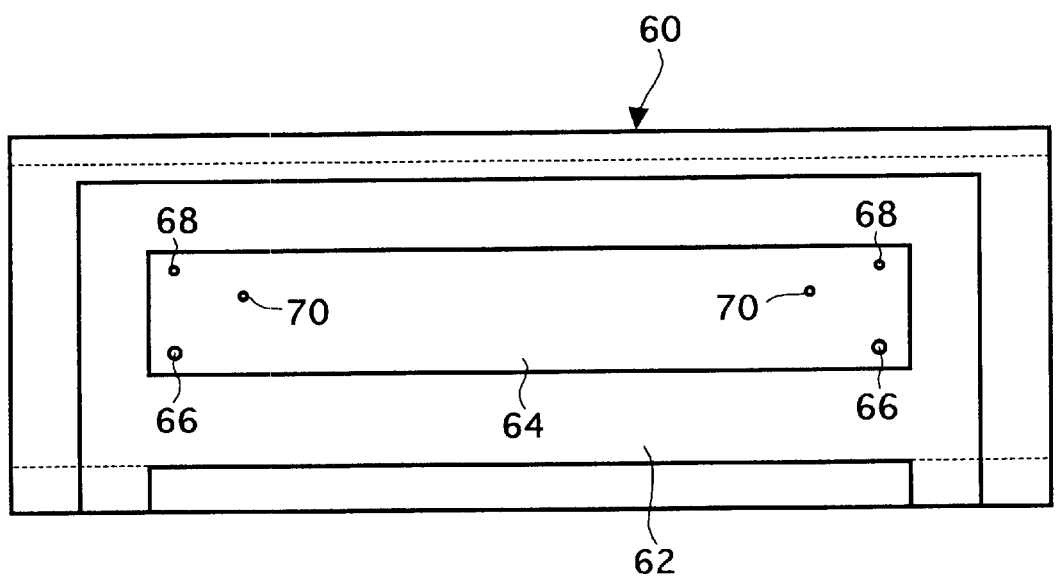
FIG. 9 is a plan view of a stage.
Figure 10:
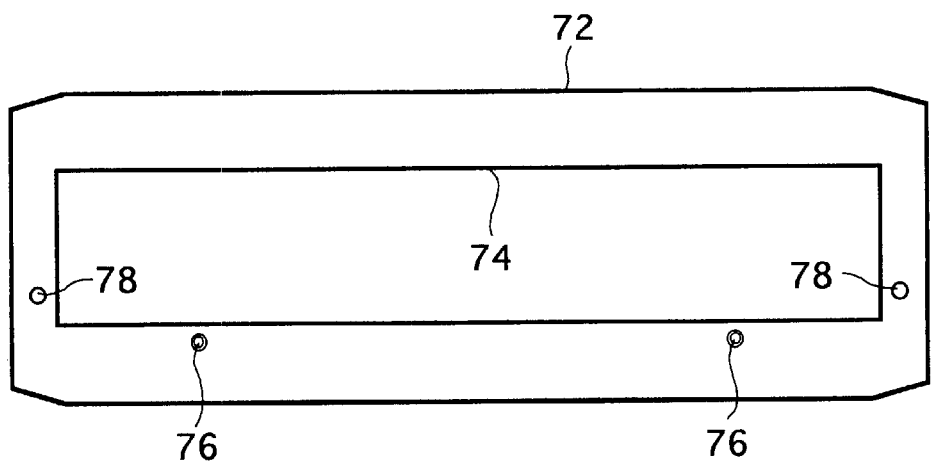
FIG. 10 is a plan view of a holder.

Referring to FIG. 9, there is shown a plan view of a stage 60 used in the assembling method according to the present invention. The stage 60 has a work mount portion 64 having a predetermined height from a bottom surface 62 of the stage 60, and the work mount portion 64 has a plurality (6 pieces in this embodiment) of positioning pins 66, 68 and 70. The stage 60 is formed of stainless steel. FIG. 10 shows a plan view of a holder 72 used in the assembling method of the present invention. The holder 72 has an opening 74, which is larger than the size of the work mount portion 64 of the stage 60, and a plurality of positioning pins 76 and 78. The holder 72 is formed of stainless steel.

According to the assembling method of the present invention, the base frame 44 is first mounted on the holder 72,. then component parts are mounted on the base frame 44, and thereafter the component parts are mounted on the work mount portion 64 of the stage 60 while being positioned relative to each other. Without this arrangement, where the size accuracy of the base frame 44 is poor, a force would be exerted on a specific part of the base frame at the time of engaging or disengaging the base frame from the pins on the stage 60, whereby the base frame would be bent and damaged. By use of the holder 72 so designed as to hold the entire body of the base frame 44, handling of component parts and engaging and disengaging of the component parts from the stage 60 are facilitated, and the risk of damaging the base frame 44 is reduced.

Figure 11:
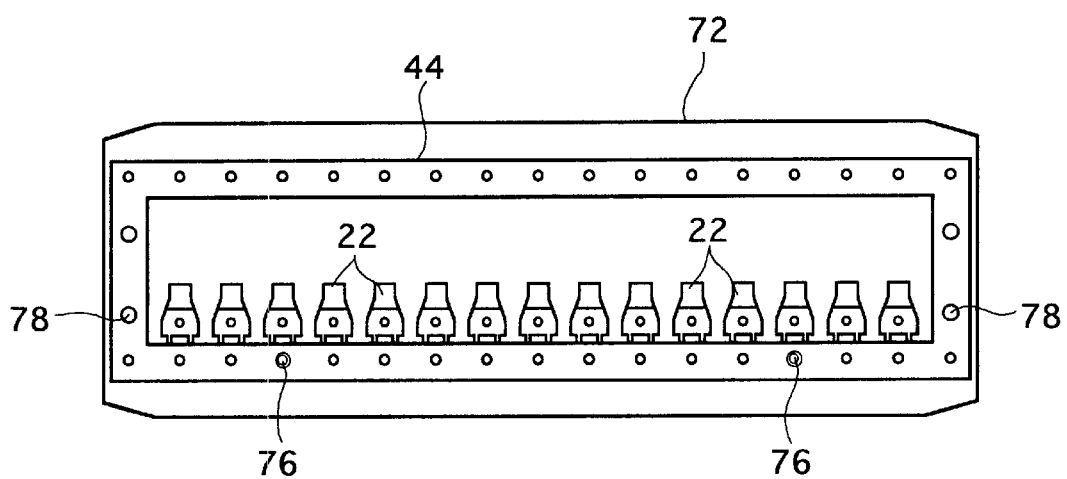
FIG. 11 is a plan view showing the condition where a base frame is mounted on the holder.
Figure 12:
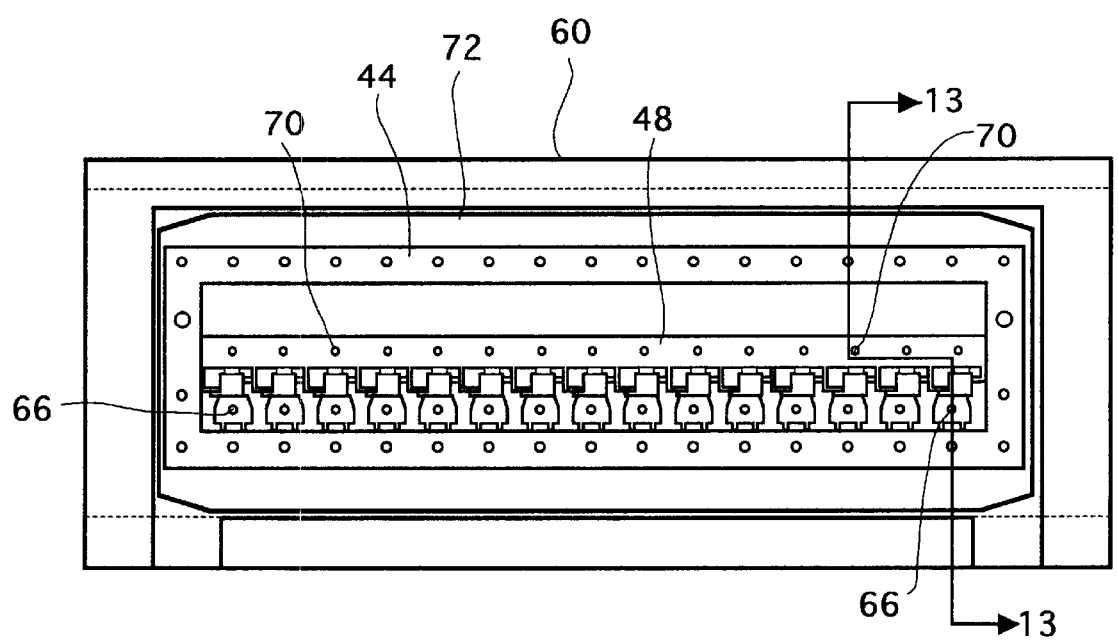
FIG. 12 is a view showing the assembly of the base electrode frame.

Referring to FIG. 11, there is shown a plan view of the condition where the base frame 44 is mounted on the holder 72. The base frame 44 is mounted on the holder 72 by inserting the positioning pins 76 and 78 of the holder 72 respectively in the positioning holes 47 and 49 of the base frame 44, whereby the base frame 44 is generally positioned. In the condition where the base frame 44 is mounted on the holder 72 as shown in FIG. 11, a first adhesive comprising a thermo-setting epoxy resin is applied to each of the actuator bases 22. Then, the base electrode frame 48 is placed on the base frame 44 mounted on the holder 72.

Figure 13:
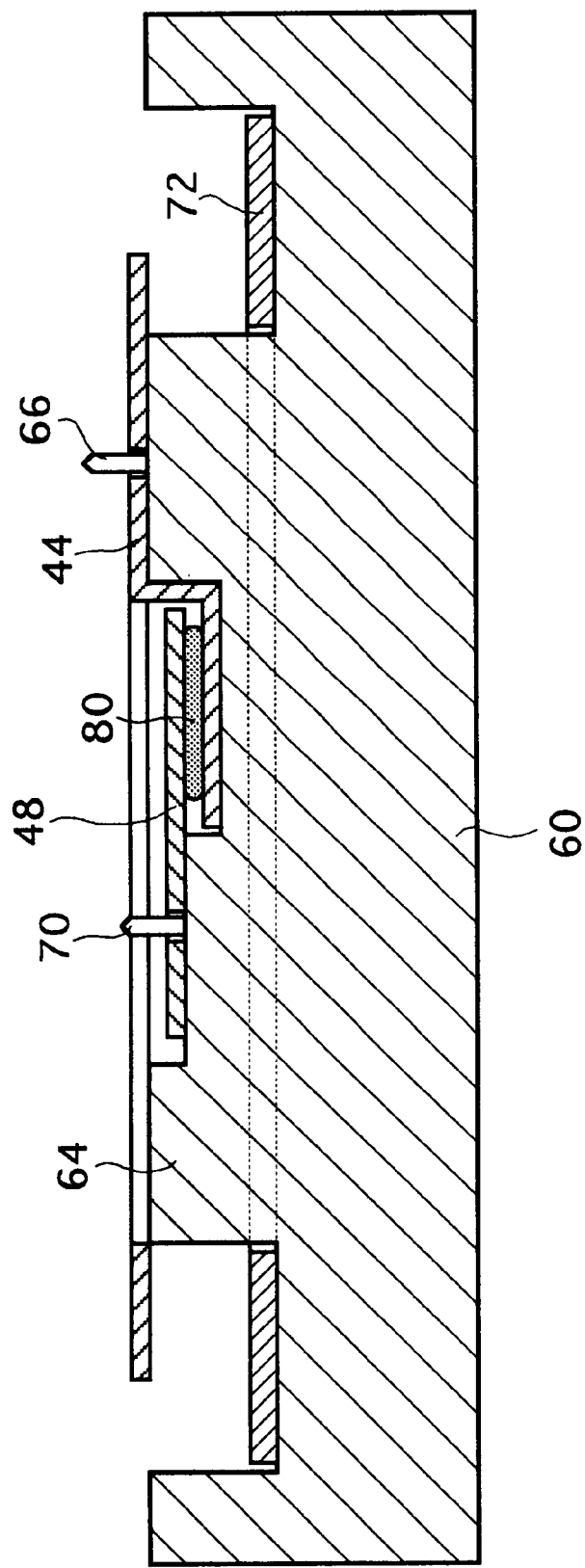
FIG. 13 is a sectional view taken along line 13—13 of FIG. 12.

When the holder 72 in this condition is mounted on the stage 60, the holder 72 drops onto the bottom surface 62 of the stage 60 as shown in FIG. 13 because the opening 74 of the holder 72 is larger than the size of the work mount portion 64 of the stage 60; at the same time, the base frame 44 and the base electrode frame 48 are mounted on the work mount portion 64 of the stage 60 while being relatively positioned by the insertion of the pins 66 and 70 respectively in the positioning holes 46 of the base frame 44 and the positioning holes 50 of the base electrode frame 48. Numeral 80 denotes the first adhesive comprising a thermo-setting epoxy resin.

Figure 14:
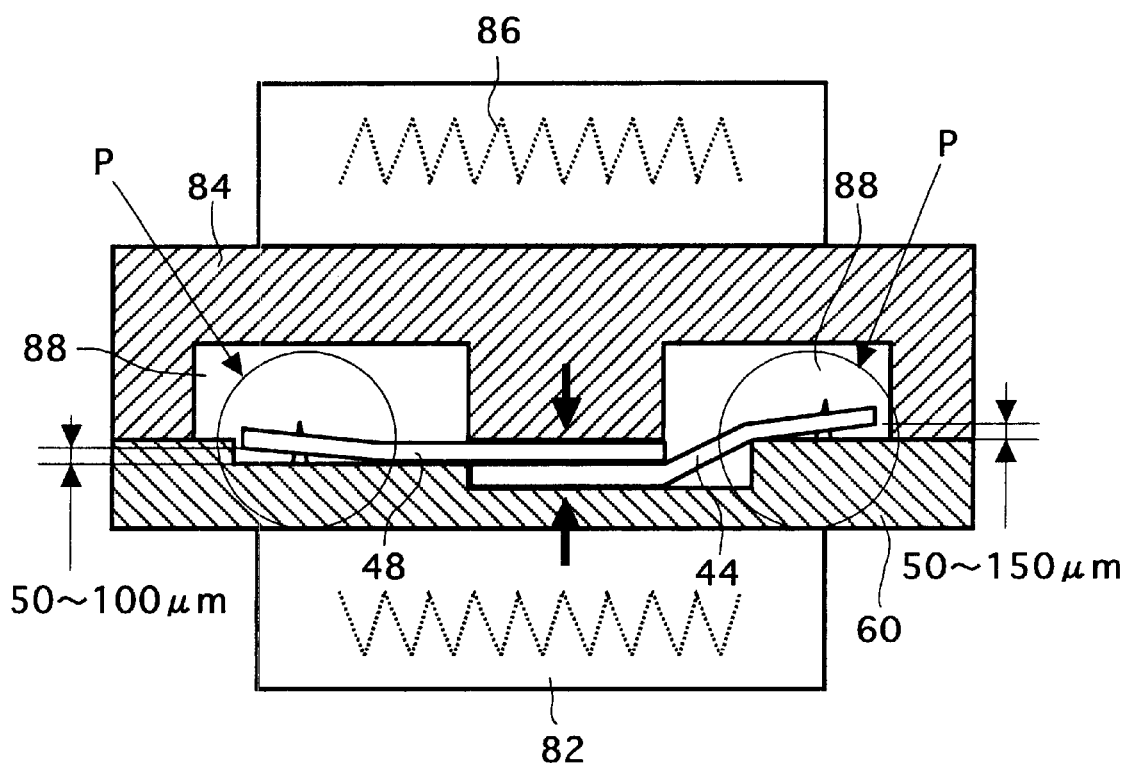
FIG. 14 is a sectional view of a heating and pressing head.

In this condition, as shown in FIG. 14, a heating and pressing head 84 is mounted on the stage 60 to clamp the base frame 44 and the base electrode frame 48 between the stage 60 and the heating and pressing head 84. The stage 60 is placed on a heater 82, and a heater 86 is placed on the heating and pressing head 84. The heating and pressing head 84 has a pair of recessed portions 88. The heating and pressing head 84 is heated to about 120° C. by the heater 86. The stage 60 mounted on the heater 82 is heated while exerting a predetermined press load, for example, about 500 Newtons onto the heating and pressing head 84. The stage 60 was heated up to 120° C. in about 90 seconds, and held at that temperature for 120 seconds, whereby the first adhesive 80 was semi-cured.

As for pressing of the base frame 44 and the base electrode frame 48, portions to be adhered of component parts should be pressed; therefore, in the beginning of experiments, only the portions to be adhered of the component parts were pressed by the heating and pressing head 84, as shown in FIG. 14. It was found that when the heating and pressing head 84 of this structure is used, positioning hole portions of the base frame 44 and the base electrode frame 48 are floated up by about 50 to 100 μm, as indicated by circles P. Namely, it was found that for securing position accuracy in the x-axis direction and Y-axis direction, stabilization of distance from the positioning hole to the portion to be adhered of each of the frames is needed. Where the heating and pressing head 84 shown in FIG. 14 was used, the position accuracy was 3σ=±59 μm.

Figure 15:
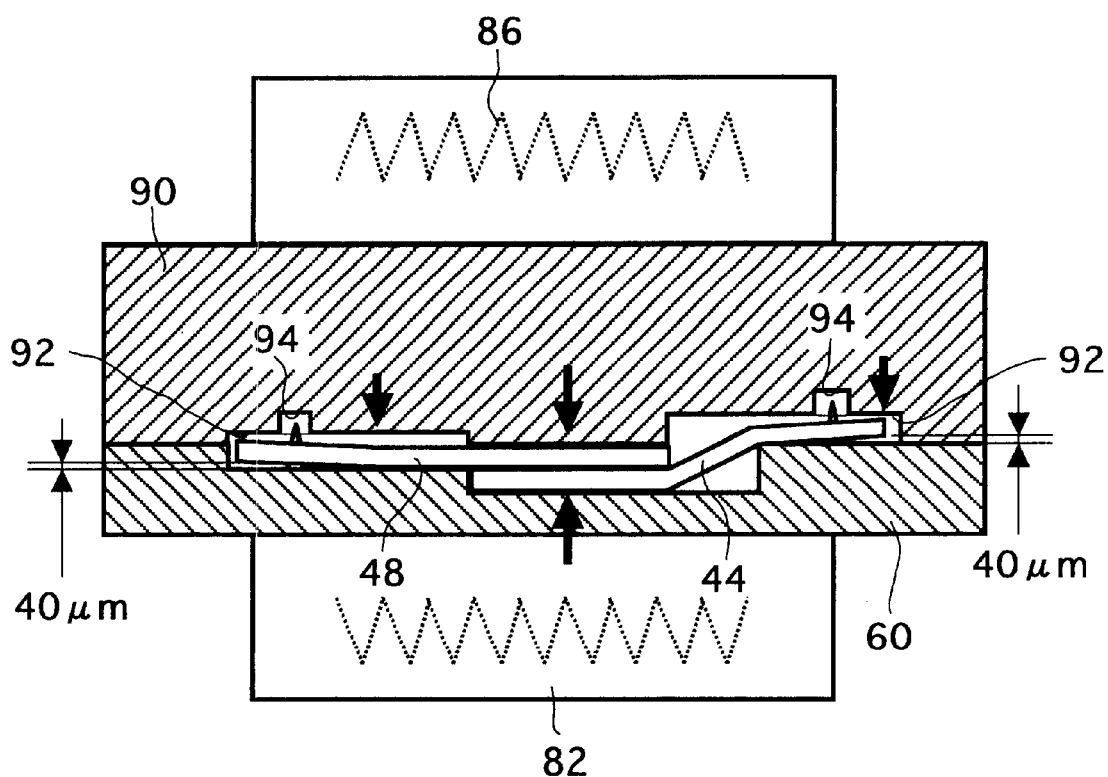
FIG. 15 is a sectional view of an improved heating and pressing head.

Therefore, a heating and pressing head 90 having a pair of recessed portions 92 with a depth of 50 μm as shown in FIG. 15 was developed, to contrive a better position accuracy. Each of the recessed portions 92 has a blind hole 94 for receiving the positioning pin. By use of the heating and pressing head 90 having such a structure, the portions near the positioning holes of each frame can be held with a small gap (50 μm), and the floating-up of each frame at the portions near the positioning holes is obviated, whereby a higher position accuracy can be contrived. Where the heating and pressing head 90 as shown in FIG. 15 was used, the position accuracy was 3σ=±11 μm.

After the first adhesive 80 is semi-cured, a second adhesive also comprising a thermo-setting epoxy resin is applied to the base electrodes 24, and a pair of piezoelectric elements 28a and 28b are placed on the second adhesive applied to each base electrode 24. Next, a second heating and pressing head different in size from the heating and pressing head 90 shown in FIG. 15 was mounted on the stage 60, and the second adhesive was semi-cured by heating while exerting a press load of about 500 Newtons onto the second heating and pressing head. In the same manner as in the heating and pressing step described above the adhesive curing temperature was 120° C. and the heating time was 210 seconds.

In this heating and pressing step, the first adhesive 80 formed somewhat thicker can be utilized as a cushion and, therefore, variations or differences in height of the piezoelectric elements 28a and 28b can be absorbed by sinking of the first adhesive 80. Furthermore, by designing the size of the second heating and pressing head at optimum values, the second adhesive can be formed to have a very small thickness of not more than 3 μm, whereby electrical connection can be secured between the base electrode 24 and the piezoelectric elements 28a and 28b.

Next, the holder 72 is disengaged from the stage 60. At this time, the base frame 44, the base electrode frame 48 and a plurality of the piezoelectric elements 28a and 28b adhered to each other are also taken out of the stage 60. A third adhesive also comprising a thermo-setting epoxy resin is applied to each of the piezoelectric elements 28a and 28b, and the movable electrode frame 52 having a plurality of movable electrodes 26 is placed on the third adhesive. When the holder 72 is again mounted on the stage 60, the holder 72 drops onto the bottom surface of the stage 60, and the positioning pins 70 of the stage 60 are inserted in the positioning holes 54 of the movable electrode frame 52, whereby the movable electrode frame 52 is mounted on the plurality of piezoelectric elements 28a and 28b while being positioned.

A third heating and pressing head different in size from the first and second heads is mounted on the stage 60, to clamp the base frame 44, the base electrode frame 48, the piezoelectric elements 28a and 28b and the movable electrode frame 52 between the stage 60 and the third heating and pressing head. The third adhesive was semi-cured by heating while exerting a press load of about 500 Newtons onto the third heating and pressing head. In the same manner as in the heating and pressing step described above, the adhesive curing temperature was 120° C. and the heating time was 210 seconds. By designing the size of the third heating and pressing head at optimum values, the third adhesive can be formed to have a very small thickness of not more than 3 μm, whereby electrical connection can be secured between the movable electrode 26 and the piezoelectric elements 28a and 28b.

Then, the holder 72 is disengaged from the stage 60. At this time, a laminate consisting of the base frame 44, the base electrode frame 48, the piezoelectric elements 28a and 28b and the movable electrode frame 52 adhered to each other is also taken out of the stage 60 while being mounted on the holder 72. Next, a fourth adhesive comprising a thermo-setting epoxy resin is applied to each of the movable electrodes 26, and the hinge plate frame 56 having a plurality of hinge plates 30 is placed on the fourth adhesive.

Figure 16:
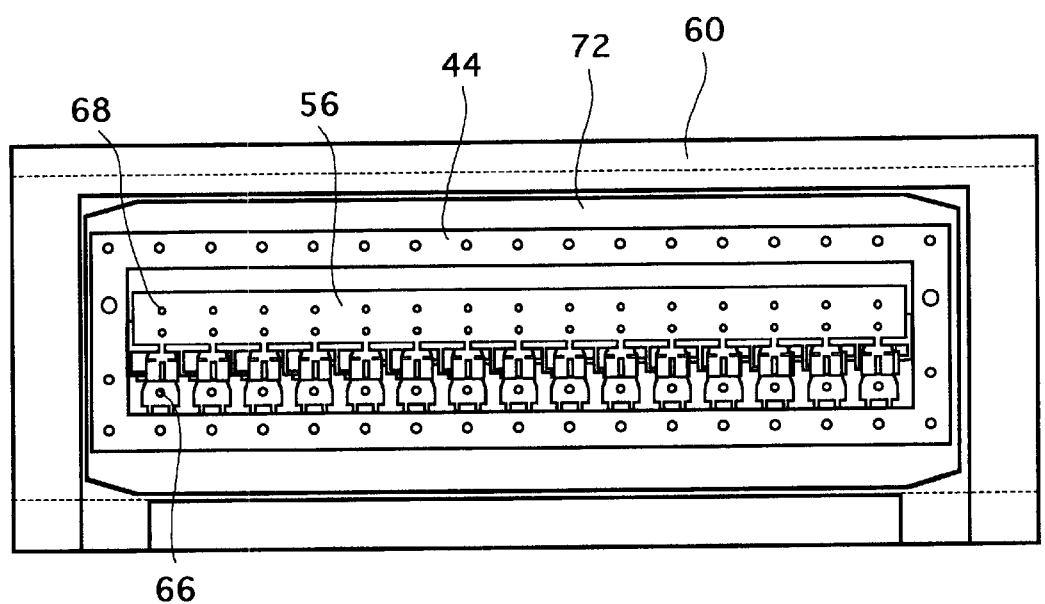
FIG. 16 is a view showing the assembly of the hinge plate frame.

When the holder 72 is mounted on the stage 60, the holder 72 drops onto the bottom surface 62 of the stage 60, while the base frame 44, the base electrode frame 48, the piezoelectric elements 28a and 28b, the movable electrode frame 52 and the hinge plate frame 56 are mounted on the work mount portion 64 of the stage 60 while being positioned relative to each other, as shown in FIG. 16. The positioning of the hinge plate frame 56 is accomplished by insertion of the positioning pins 68 of the stage 60 into the positioning holes 58 of the hinge plate frame 56.

A fourth heating and pressing head different in size from the first to third heads is mounted on the stage 60, to clamp the base frame 44, the base electrode frame 48, the piezoelectric elements 28a and 28b, the movable electrode frame 52 and the hinge plate frame 56 between the stage 60 and the fourth heating and pressing head. The fourth adhesive was semi-cured by heating while exerting a press load of about 500 Newtons onto the fourth heating and pressing head. In the same manner as in the heating and pressing step described above, the adhesive curing temperature was 120° C. and the heating time was 210 seconds.

Figure 17:
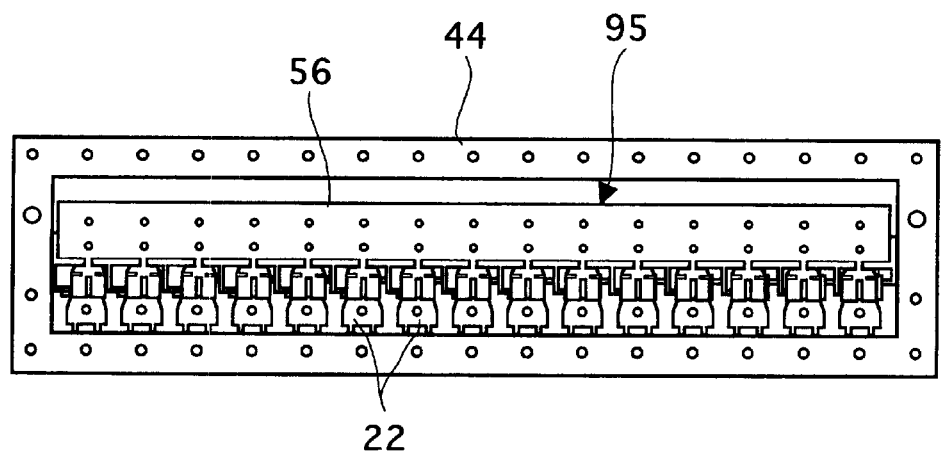
FIG. 17 is a view showing a piezo micro-actuator array assembled.
Figure 18:
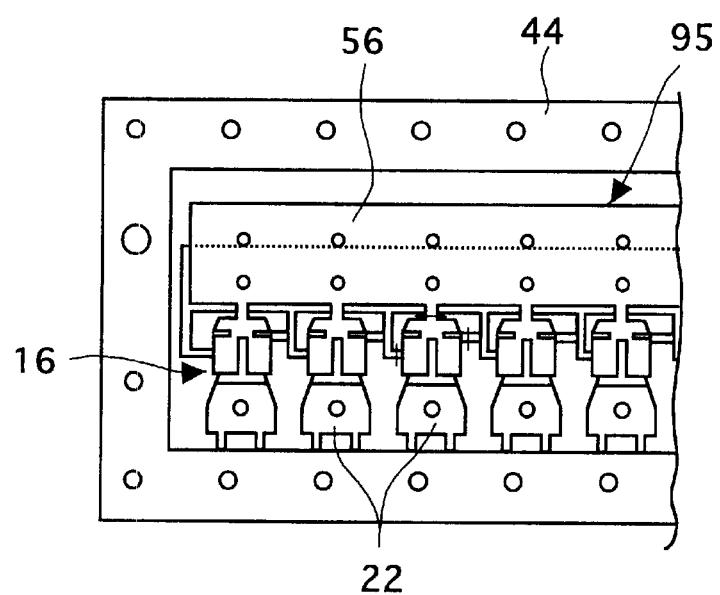
FIG. 18 is a partly broken enlarged view of FIG. 17.

FIG. 17 shows a piezo micro-actuator array 95 assembled in this manner. FIG. 18 is an enlarged view of the same. Next, the piezo micro-actuator array 95 thus assembled was placed into a heating furnace, and heated at 120° C. for about 30 minutes to fully cure the first to fourth adhesives.

Figure 19:
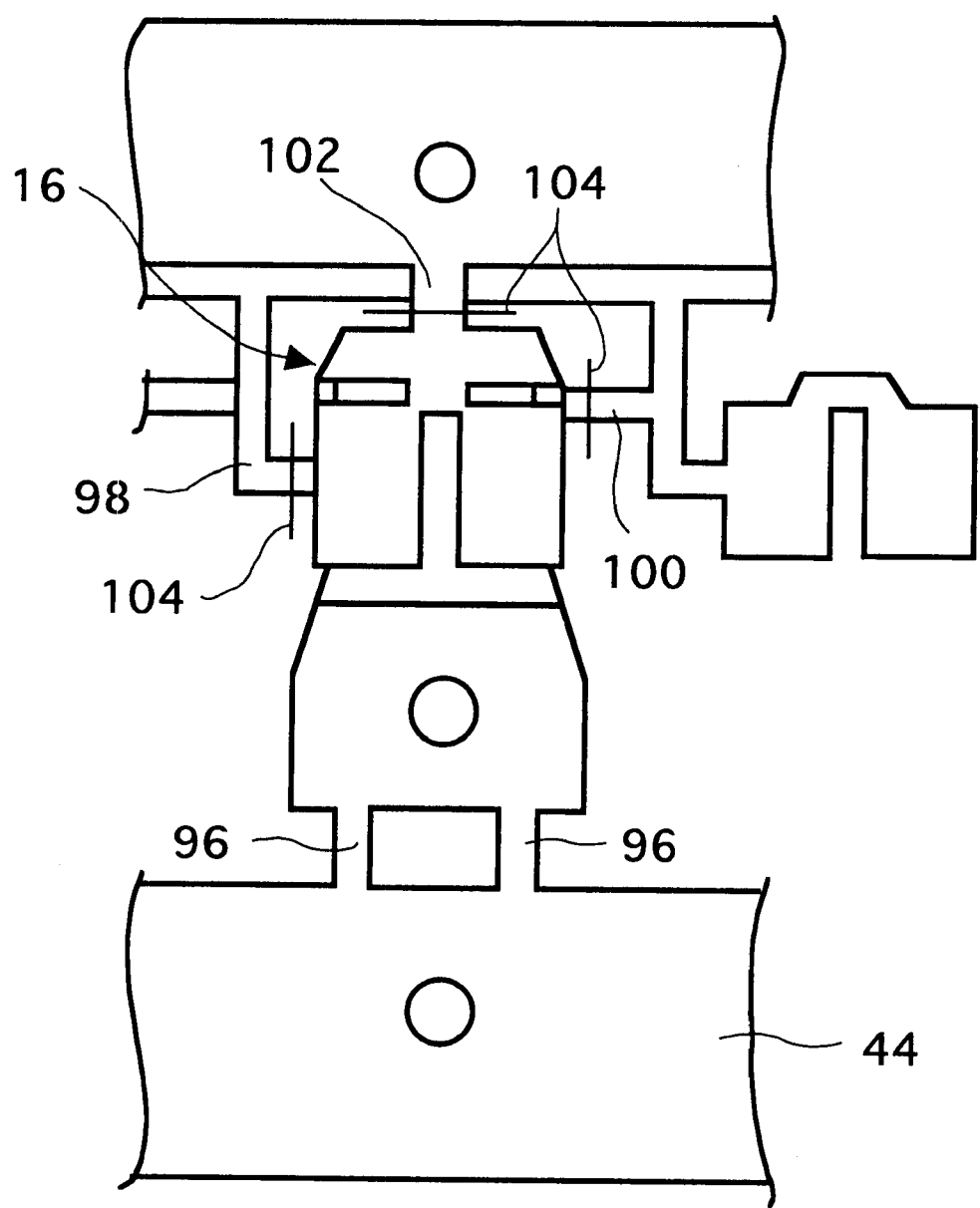
FIG. 19 is an illustration of a cutting step.

Finally, as shown in FIG. 19, each of the bridges 98, 100 and 102 of the base electrode frame 48, the movable electrode frame 52 and the hinge plate frame 56 was cut in a stroke at positions indicated by numeral 104 by use of stepped cutting dies. By this, assembly of a plurality (16 pieces in this embodiment) of piezo micro-actuators 16 connected to the base frame 44 through the bridges 96 is completed. Ordinary handling is carried out keeping the plurality of piezo micro-actuators 16 connected to the base frame 44, and the bridge 96 is cut to separate each of the piezo micro-actuators 16 at the time of fixing the piezo micro-actuator 16 to the tip end portion of the actuator arm.

Figure 20:
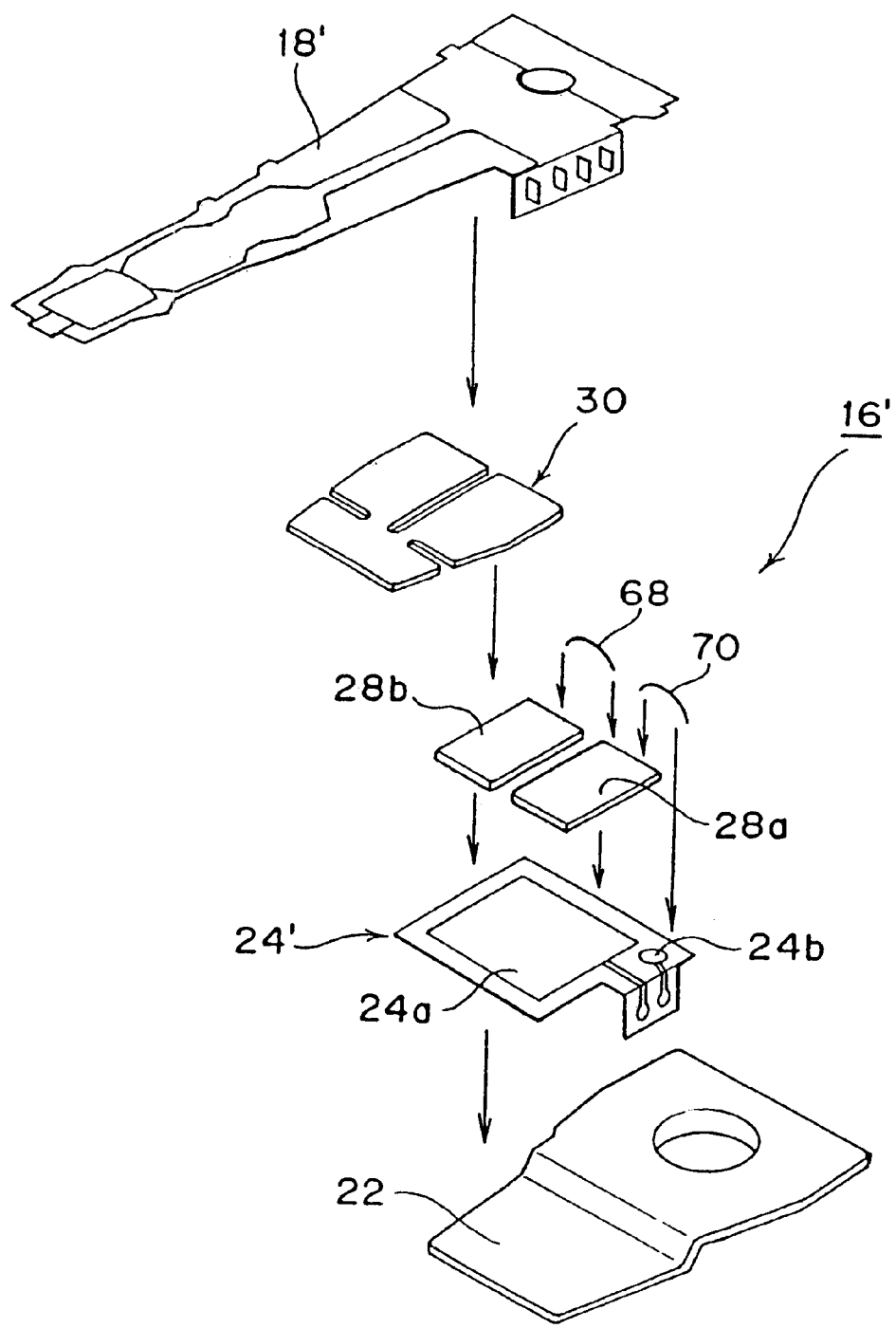
FIG. 20 is an exploded perspective view of a piezo micro-actuator, according to a second embodiment.

Referring to FIG. 20, there is shown an exploded perspective view of a piezo micro-actuator 16' according to a second embodiment of the present invention. A base electrode 24' is adhered to an actuator base 22. The base electrode 24' has a first conductor pattern 24a having a larger area and a second conductor pattern 24b having a smaller area and independent from the first conductor pattern. A pair of shearing type piezoelectric elements 28a and 28b are adhered to the base electrode 24'. The pair of piezoelectric elements 28a and 28b are bonding-connected to each other by a first wire 108, and the piezoelectric element 28a is bonding-connected to the second conductor pattern 24b of the base electrode 24' by a second wire 110. A hinge plate 30 is adhered to the piezoelectric elements 28a and 28b. Then, a suspension 18' is attached to the hinge plate 30 by spot welding or the like.

In the piezo micro-actuator 16' according to this embodiment, the movable electrode 26 in the first embodiment is omitted, and the pair of piezoelectric elements 28a and 28b are connected to the conductor pattern 24b of the base electrode 24' by the two wires 108, 110. The piezo micro-actuator 16' according to this second embodiment is also assembled in the same manner as the assembling method described above. It is noted that in the case of this assembling method, a hinge plate frame 56 having a plurality of hinge plates 30 is mounted on a third adhesive applied to each of the piezoelectric elements 28a and 28b.

Then, a fifth heating and pressing head different in size from the first to fourth heads is mounted on a stage 60, to clamp a base frame 44, a base electrode frame 48, the piezoelectric elements 28a and 28b and the hinge plate frame 56 between the stage 60 and the fifth heating and pressing head. The third adhesive is semi-cured by heating while exerting a press load of about 500 Newtons onto the fifth heating and pressing head. The adhesive curing temperature is 120° C. and the heating time is 210 seconds.

The steps of semi-curing the first and second adhesives are the same as in the method of assembling the piezo micro-actuator 16 according to the first embodiment described above. A piezo micro-actuator array thus assembled is placed into a heating furnace, and is heated at 120° C. for about 30 minutes to fully cure the first to third adhesives. Next, in the same manner as the cutting step shown in FIG. 19, each of the bridges of the base frame 44 and the base electrode frame 48 is cut, whereby a plurality of piezo micro-actuators 16' connected to the base frame 44 through bridges 96 can be produced.

According to the present invention, there is provided a method of assembling a micro-actuator which is suitable for mass production.

The present invention is not limited to the details of the above-described preferred embodiments. The scope of the invention is defined by the appended claims and all changes and modifications as fall within the equivalence of the scope of the claims are therefore to be embraced by the invention.

What is claimed is:

1. A method of assembling a micro-actuator, comprising the steps of:

placing a base frame having a plurality of actuator bases on a stage;

applying a first adhesive to each of said actuator bases;

placing a base,electrode frame having a plurality of base electrodes on said first adhesive applied to said base frame;

clamping said base frame and said base electrode frame between said stage and a first head, followed by heating for a first predetermined period of time while exerting a predetermined first press load onto said first head to semi-cure said first adhesive;

applying a second adhesive to each of said base electrodes;

placing a plurality of piezoelectric elements on said second adhesive applied to each of said base electrodes;

clamping said base frame, said base electrode frame and said piezoelectric elements between said stage and a second head, followed by heating for a second predetermined period of time while exerting a predetermined second press load onto said second head to semi-cure said second adhesive;

applying a third adhesive to said piezoelectric elements;

placing a hinge plate frame having a plurality of hinge plates on said third adhesive applied to each of said piezoelectric elements; and clamping said base frame, said base electrode frame, said piezoelectric elements and said hinge plate frame between said stage and a third head, followed by heating for a third predetermined period of time while exerting a predetermined third press load onto said third head to semi-cure said third adhesive.

2. A method of assembling a micro-actuator as set forth in claim 1, wherein said first to third adhesives comprise a thermo-setting epoxy resin.

3. A method of assembling a micro-actuator as set forth in claim 1, wherein said stage has a plurality of positioning pins, while said base frame, said base electrode frame and said hinge plate frame respectively have a plurality of positioning holes, and said base frame, said base electrode frame and said hinge plate frame are mounted on said stage while being relatively positioned by insertion of said positioning pins in said positioning holes.

4. A method of assembling a micro-actuator as set forth in claim 1, wherein said stage includes a work mount portion having a plurality of positioning pins, a predetermined height from a bottom surface of said stage and a predetermined size, and said base frame, said base electrode frame and said hinge plate frame are once mounted on a holder having an opening larger than the size of said work mount portion, before being mounted on said work mount portion of said stage.

5. A method of assembling a micro-actuator as set forth in claim 4, wherein said base frame, said base electrode frame and said hinge plate frame respectively have a plurality of positioning holes, and said base frame, said base electrode frame and said hinge plate frame are mounted on said work mount portion of said stage while being relatively positioned by insertion of said positioning pins in said positioning holes.

6. A method of assembling a micro-actuator as set forth in claim 1, further comprising a step of heating an adhered laminate obtained in claim 1, at a predetermined temperature for a fourth predetermined period of time to fully cure said first to third adhesives.

7. A method of assembling a micro-actuator as set forth in claim 6, wherein each of said actuator bases, each of said base electrodes and each of said hinge plates are connected respectively to said base frame, said base electrode frame and said hinge plate frame through a bridge, and said method further comprises a step of cutting each of said bridges of said base electrode frame and said hinge plate frame after the step of fully curing said adhesives.

8. A method of assembling a micro-actuator, comprising the steps of:

placing a base frame having a plurality of actuator bases on a stage;

applying a first adhesive to each of said actuator bases;

placing a base electrode frame having a plurality of base electrodes on said first adhesive applied to said base frame;

clamping said base frame and said base electrode frame between said stage and a first head, followed by heating for a first predetermined period of time while exerting a predetermined first press load onto said first head to semi-cure said first adhesive;

applying a second adhesive to each of said base electrodes;

placing a plurality of piezoelectric elements on said second adhesive applied to each of said base electrodes;

clamping said base frame, said base electrode frame and said piezoelectric elements between said stage and a second head, followed by heating for a second predetermined period of time while exerting a predetermined second press load onto said second head to semi-cure said second adhesive;

applying a third adhesive to said piezoelectric elements;

placing a movable electrode frame having a plurality of movable electrodes on said third adhesive applied to each of said piezoelectric elements;

clamping said base frame, said base electrode frame, said piezoelectric elements and said movable electrode frame between said stage and a third head, followed by heating for a third predetermined period of time while exerting a predetermined third press load onto said third head to semi-cure said third adhesive;

applying a fourth adhesive to each of said movable electrodes;

placing a hinge plate frame having a plurality of hinge plates on said fourth adhesive applied to each of said movable electrodes; and clamping said base frame, said base electrode frame, said piezoelectric elements, said movable electrode frame and said hinge plate frame between said stage and a fourth head, followed by heating for a fourth predetermined period of time while exerting a predetermined fourth press load onto said fourth head to semi-cure said fourth adhesive.

9. A method of assembling a micro-actuator as set forth in claim 8, wherein said first to fourth adhesives comprise a thermo-setting epoxy resin.

10. A method of assembling a micro-actuator as set forth in claim 8, wherein said stage has a plurality of positioning pins, while said base frame, said base electrode frame, said movable electrode frame and said hinge plate frame respectively have a plurality of positioning holes, and said base frame, said base electrode frame, said movable electrode frame and said hinge plate frame are placed on said stage while being relatively positioned by insertion of said positioning pins in said positioning holes.

11. A method of assembling a micro-actuator as set forth in claim 8, wherein said stage includes a work mount portion having a plurality of positioning pins, a predetermined height from a bottom surface of said stage and a predetermined size, and said base frame, said base electrode frame, said movable electrode frame and said hinge plate frame are once mounted on a holder having an opening larger than the size of said work mount portion, before being placed on said work mount portion of said stage.

12. A method of assembling a micro-actuator as set forth in claim 11, wherein said base frame, said base electrode frame, said movable electrode frame and said hinge plate frame respectively have a plurality of positioning holes, and said base frame, said base electrode frame, said movable electrode frame and said hinge plate frame are mounted on said work mount portion of said stage while being relatively positioned by insertion of said positioning pins in said positioning holes.

13. A method of assembling a micro-actuator as set forth in claim 8, further comprising a step of heating an adhered laminate obtained in claim 1 at a predetermined temperature for a fifth predetermined period of time to fully cure said first to fourth adhesives.

14. A method of assembling a micro-actuator as set forth in claim 13, wherein each of said actuator bases, each of said base electrodes, each of said movable electrodes and each of said hinge plates are connected respectively to said base frame, said base electrode frame, said movable electrode frame and said hinge plate frame through a bridge, and said method further comprises a step of cutting each of said bridges of said base electrode frame, said movable electrode frame and said hinge plate frame after the step of fully curing said adhesives.

* * * * *

UNITED STATES PATENT AND TRADEMARK OFFICE
CERTIFICATE OF CORRECTION

PATENT NO.    : 6,467,141 B2
DATED         : October 22, 2002
INVENTOR(S)   : Okada et al.

It is certified that error appears in the above-identified patent and that said Letters Patent is hereby corrected as shown below:

<u>Title page,</u>
Item [57], ABSTRACT,
Line 10, delete "is,applied" insert -- is applied -- therefor.

<u>Column 10,</u>
Line 39, delete "base,electrode" insert -- base electrode -- therefor.

<u>Column 11,</u>
Line 31, delete "1, at" insert -- 1 at -- therefor.

<u>Column 12,</u>
Line 53, delete "1" insert -- 8 -- therefor.

Signed and Sealed this

Twenty-ninth Day of April, 2003

JAMES E. ROGAN
*Director of the United States Patent and Trademark Office*